United States Patent [19]

Yamada

[11] Patent Number: 4,721,989
[45] Date of Patent: Jan. 26, 1988

[54] CCD WITH TRANSFER CHANNEL AT LOWER POTENTIAL THAN SUPPLY CHANNEL

[75] Inventor: Tetsuo Yamada, Yokohama, Japan

[73] Assignee: Kabushiki Kaisha Toshiba, Kawasaki, Japan

[21] Appl. No.: 57,304

[22] Filed: Jun. 4, 1987

Related U.S. Application Data

[63] Continuation of Ser. No. 810,220, Dec. 18, 1985.

[30] Foreign Application Priority Data

Dec. 19, 1984 [JP] Japan .................. 59-267708

[51] Int. Cl.⁴ .............. H01L 29/78; H01L 27/14; H01L 31/00; G11C 19/28
[52] U.S. Cl. ........................... 357/24; 357/30; 357/89; 377/62
[58] Field of Search ............. 357/24, 30; 377/57-63

[56] References Cited

U.S. PATENT DOCUMENTS

| | | | |
|---|---|---|---|
| 3,995,302 | 11/1976 | Amelio | 357/24 |
| 4,065,847 | 1/1978 | Borel et al. | 357/24 |
| 4,206,371 | 6/1980 | Weimer | 357/30 |
| 4,504,848 | 3/1985 | Matsumoto et al. | 357/30 |

FOREIGN PATENT DOCUMENTS 2007937 5/1979 United Kingdom .
2065974 7/1981 United Kingdom .

OTHER PUBLICATIONS

IEEE Transactions on Electron Devices, vol. ED-13, No. 1, Jan. 1984, pp. 83-88, Ishihara et al., "Interline CCD Image Sensor with an Antiblooming Structure".

Primary Examiner—Gene M. Munson
Attorney, Agent, or Firm—Finnegan, Henderson, Farabow, Garrett & Dunner

[57] ABSTRACT

A solid-state image sensing device has a plurality of first CCDs for transferring a charge along the column direction and a second CCD for transferring the charge supplied from the first CCDs along the row direction. The first and second CCDs have n-type first transfer channels and an n-type second transfer channel which are formed on a p-type semiconductor body. The p-type semiconductor body has a first region contacting the bottom surface of the first transfer channels and a second region contacting the bottom surface of the second transfer channel. An impurity concentration of the second region is lower than that of the first region.

9 Claims, 9 Drawing Figures

CCD WITH TRANSFER CHANNEL AT LOWER POTENTIAL THAN SUPPLY CHANNEL

This application is a continuation of application Ser. No. 810,220, filed Dec. 18, 1985.

BACKGROUND OF THE INVENTION

The present invention relates to a charge transfer device and, more particularly, to an interline transfer type solid-stage image sensing device.

A conventional solid-state image sensing device is used, for example, as a light-receiving portion of a TV camera. The device is a semiconductor chip having a large number of photoelectric transducers for generating charges corresponding to the intensity of light incident thereon. For this reason, solid-state image sensing devices have received a great deal of attention in the development of compact lightweight TV cameras.

In a conventional interline transfer type solid-state image sensing device, a plurality of photoelectric transducer elements are arranged on a semiconductor chip in a matrix form. Charges generated by the photoelectric transducer elements are supplied by an output circuit through a plurality of first charge-coupled devices and a single second charge-coupled device. The first charge-coupled devices respectively have first transfer channels extending along the column direction, and the second charge-coupled device has a second transfer channel extending along the row direction. The first and second transfer channels are formed as a single semiconductor region within the semiconductor chip, so as to obtain identical conductivity and impurity concentration. Each first charge-coupled device receives charges from the photoelectric transducer elements of the corresponding column and transfers them within the corresponding first transfer channel. The second charge-coupled device receives charges from the first charge-coupled devices and transfers them within the second transfer channel. The conventional device has a gate electrode for controlling charge transfer between the first and second charge-coupled devices. The gate electrode is insulatively formed on the first transfer channels near the second transfer channel. The charges are transferred from the first transfer channels to the second transfer channel in response to a clock pulse supplied to the gate electrode.

The second charge-coupled device is arranged along the second transfer channel in the row direction so as to transfer the received charges to the output circuit, and has a plurality of first and second electrodes for receiving clock pulses from, for example, a two-phase clock pulse. The first transfer electrodes are formed over and insulated from the second transfer channel, and the second transfer electrodes are insulatively formed over parts of the first transfer channels sufficiently adjacent to the gate electrode as well as over the second transfer channel so as to properly receive the charges from the first charge-coupled devices.

A conventional solid-stage image sensing device has, for example, non-structure photodiodes as photoelectric transducer elements. In this case, a p-type region is formed in the surface area of an n-type semiconductor substrate and n-type regions are formed in the surface area of the p-type region to constitute a matrix array of the photoelectric transducer elements. The n-type substrate is used as a overflow drain for discharging the excess charge from each photoelectric transducer element. The first and second transfer channels are formed in the surface area of the p-type region as a single n-type region.

When a clock pulse is supplied to the first transfer electrode, a charge is stored in the second transfer channel under the first transfer electrode. However, when the clock pulse is supplied to the second transfer electrode, the charge is stored in the first and second transfer channels under the second transfer electrode. In this case, the potential at the second transfer channel is set to be equal to that of the first transfer channel. For this reason, the distribution of the charge stored in the first and second transfer channels under the second transfer electrode is substantially uniform. The charges supplied to the second charge-coupled devices are mainly transferred in the second transfer channel to the output circuit. Some of the charges are moved into end stages of the second channels during the transfer. This leads, in effect, to an increased transfer distance of the charge and prevents self-induced generation of a drift electric field. Therefore, high-speed charge transfer cannot be performed in the conventional solid-state image sensing device.

SUMMARY OF THE INVENTION

It is, therefore, an object of the present invention to provide a charge transfer device which can perform high-speed charge transfer.

According to the present invention, there is provided a charge transfer device which comprises a substrate; a charge supplying section including a plurality of supply channels formed in the surface area of the substrate and extending in a first direction for supplying charges through the supply channels; a charge coupled device including a transfer channel formed in the surface area of the substrate in contact with the supply channels and extending in a second direction different from the first direction and a plurality of first and second electrodes insulatively formed over the transfer channel and arranged in the second direction, which transfers the charges in the second direction by selectively applying a control voltage to the first and second electrodes, the first electrodes having portions insulatively formed over the supply channels for causing the charges from the supply channels to be received in the transfer channel; and a potential control section for permitting the electrostatic potential energy in the transfer channel to be set at a level lower than that level in each supply channel.

DETAILED DESCRIPTION OF THE PREFERRED EMBODIMENT

Figure 1:
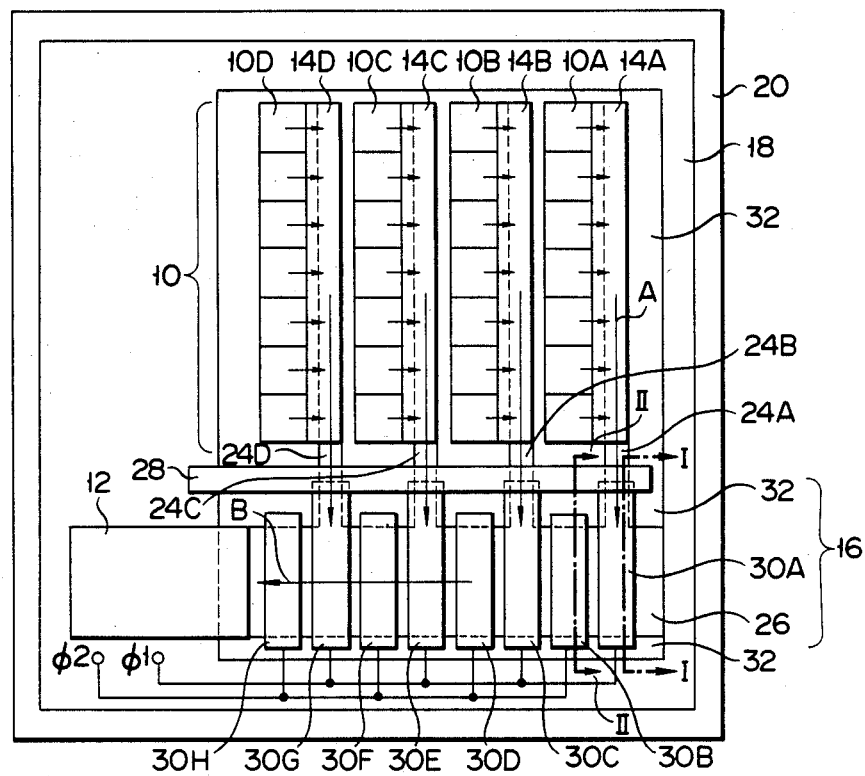
FIG. 1 is a top view of a solid-state image sensing device according to an embodiment of the present invention.
Figure 2:
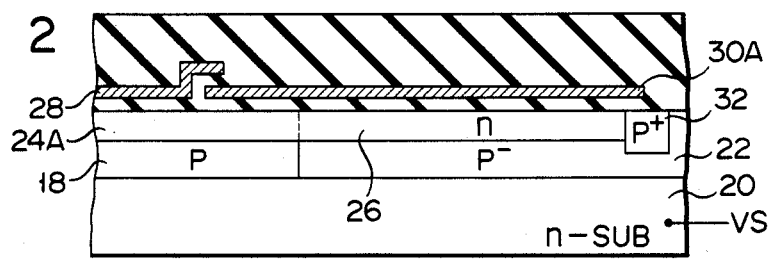
FIG. 2 is a sectional view of the solid-state image sensing device taken along the line I—I of FIG. 1.
Figure 3:
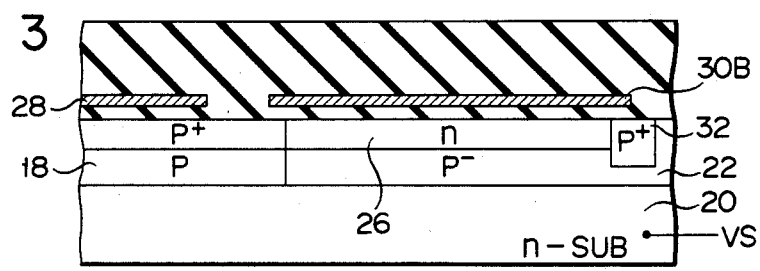
FIG. 3 is a sectional view of the solid-state image sensing device taken along the line II—II of FIG. 1.

The structure of a solid-state imaging sensing device according to an embodiment of the present invention will be described with reference to FIGS. 1 to 3. FIG. 1 is a top view of the solid-state image sensing device, FIG. 2 is a sectional view thereof taken along the line I—I of FIG. 1, and FIG. 3 a sectional view thereof taken along the line II—II of FIG. 1. This solid-state image sensing device is a semiconductor chip having matrix array 10 of photoelectric transducer elements, output circuit 12, and a transfer section to be described later. The photoelectric transducer elements in matrix array 10 generate charge carriers (e.g., electrons) in accordance with an intensity level of light incident thereon. The transfer section transfers the charge from array 10 to circuit 12. A voltage signal corresponding to the input charge level appears in circuit 12. The transfer section has first charge-coupled devices (CCDs) 14A to 14D for receiving charges from photoelectric transducer elements 10A to 10D in respective columns, and a second charge-coupled device (CCD) 16 for receiving charges from CCDs 14A to 14D. The charges are transferred from CCD 16 to circuit 12.

In the solid-state image sensing device of this embodiment, p-type region 18 is formed in a surface area of n-type silicon substrate 20 to constitute array 10, having npn-structure photodiodes as photoelectric transducer elements 10A to 10D. N-type regions (not shown) are formed in a surface area of region 18 in a matrix form. The device also has $p^-$-type region 22 in the surface area of region 18. Regions 18 and 22 have an impurity concentration ratio of, e.g., 3:2. Region 18 is formed such that a p-type impurity is ion-implanted in the surface area of substrate 20, and thereafter a p-type impurity is again ion-implanted, except in that area corresponding to region 22. The doped p-type impurity is thermally diffused by a drive-in process. The impurity concentration of region 22 is determined by the first ion implantation. The impurity concentration of region 18 is determined by the first and second ion implantations.

CCDs 14A to 14D have first transfer channels 24A to 24D formed in the surface area of p-type region 18 and extending along the column direction. CCD 16 has second transfer channel 26 formed in the surface area of $p^-$-type region 22 and extending along the row direction. Channels 24A to 24D and 26 are formed as a single n-type region of a uniform impurity concentration. The solid-state image sensing device has gate electrode 28 insulatively formed over channels 24A to 24D and near transfer channel 26. Electrode 28 is connected to a pulse generator (not shown). When a control pulse is supplied to electrode 28, the charge is transferred from CCDs 14A to 14D to CCD 16 through channels 24A to 24D. CCD 16 has transfer electrodes 30A to 30H insulatively formed over channel 26 and arranged along the row direction, so as to control the charge transfer along the row direction. Electrodes 30A, 30C, 30E and 30G are insulatively formed above part of channels 24A to 24D, as well as on channel 26. Part of electrode 28 insulatively overlays electrodes 30A, 30C, 30E and 30G. Electrodes 30A, 30C, 30E and 30G are connected to terminal $\phi1$, and electrodes 30B, 30D, 30F and 30H are connected to terminal $\phi2$. Terminals $\phi1$ and $\phi2$ receive clock pulses as a control voltage from, e.g., a 2-phase clock generator (not shown). Charges from CCDs 14A to 14D are transferred toward circuit 12 when the control pulses are selectively supplied to electrodes 30A to 30H. In this device, $p^+$-type region 32 is formed at the outer side of the first and second transfer channels and at the periphery of the photoelectric transducer elements.

CCDs 14A to 14D receive charges from elements 10A to 10D of their respective columns and transfer them within channels 24A to 24D in direction A of FIG. 1. Electrode 28 periodically receives the control pulse from the pulse generator. When the control pulse is supplied to electrode 28, CCD 16 receives charges from CCDs 14A to 14D. For example, the charge transferred by CCD 14A is injected in a portion of channel 26 under electrode 30A through channel 24A. The charge transferred by CCD 14B is injected in a portion of channel 26 under electrode 30C through channel 24B. The charges from the third and fourth CCDs are also injected in portions of channel 26 under electrodes 30E and 30G, respectively. Electrodes 30A to 30H sequentially receive clock pulses from the two-phase clock generator in the order named. The travelling charges are then transferred within channel 26 along direction B of FIG. 1. Circuit 12 receives the charges through channel 26 and generates a voltage signal corresponding to the input charge level.

Figure 4:
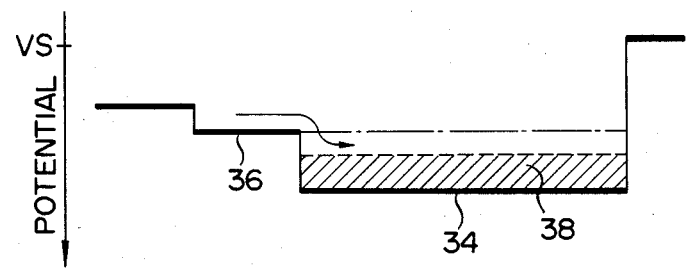
FIG. 4 is a graph showing a potential distribution in the sectional view of FIG. 2.
Figure 5:
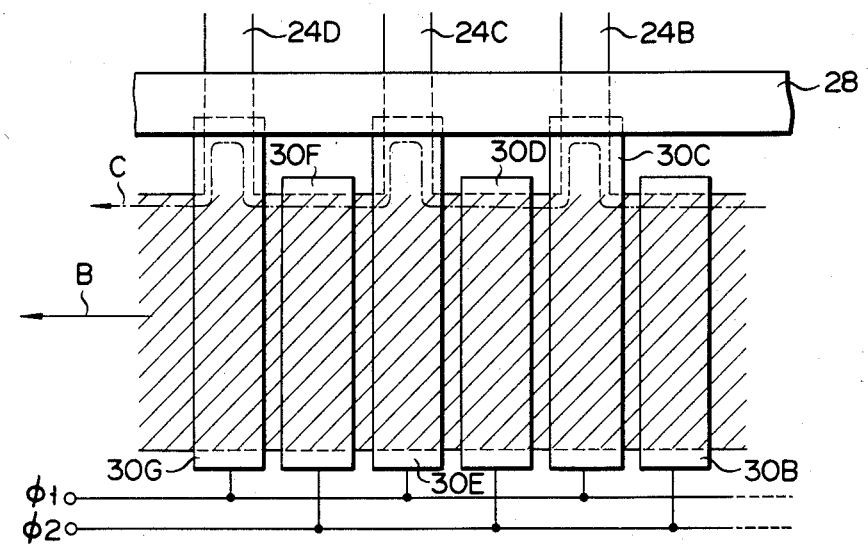
FIG. 5 is a top view showing a planar distribution of the charge transferred in the solid-state image sensing device.

In the above embodiment, n-type channels 24A to 24D and 26 are formed in contact with respective p-type an $p^-$-type regions 18 and 22. For this reason, when the clock pulse is supplied to electrodes 30A to 30H, a potential at channel 26 is higher than those at channels 24A to 24D, in accordance with the difference in impurity concentrations of regions 18 and 22, as shown in FIG. 4. Referring to FIG. 4, reference numeral 34 denotes a potential level in the portion of transfer channel 26 under, for example, the electrode 30C. The reference numeral 36 denotes a potential level in the portion of transfer channel 24B under electrode 30C. When the clock pulse is supplied to electrodes 30A, 30C, 30E and 30G, charges from CCDs 14A to 14D flows to channel 26 through channels 24A to 24D, as indicated by the arrow of FIG. 4. For example, charge 38 shown in FIG. 4 flows from channel 24B to channel 26. Thus, channels 24A to 24D act as a path for supplying charges from CCDs 14A to 14D to CCD 16 under electrodes 30A, 30C, 30E and 30G, respectively. The charge transferred by CCD 16 is stored in channel 26, as shown by the hatched area in FIG. 5. The charge is substantially not stored in channels 24A to 24D under electrodes 30A, 30C, 30E and 30G. In this embodiment, when the charges are transferred from the portion of channel 26 under electrodes 30B, 30D and 30F to the portion of the channel 26 under electrodes 30C, 30E and 30G on their way to circuit 12, these charges will not be temporarily diverted into channels 24A to 24D because of a potential difference barrier. For this reason, transfer distance of the charge from CCD 16 to circuit 12 can be shortened. Furthermore, since the charge cannot move from channel 26 to channels 24A to 24C, the potential at channel 26 is greatly changed by storing the charge in comparison with the conventional case. In the device of the present invention, the self inducted drift electric field in channel 26 is proportionally increased to this change. Therefore, the charge can be transferred at sufficiently high speed.

In a conventional solid-state image sensing device, n-type first and second transfer channels are formed on a common p-type region. For this reason, as indicated by the line with alternating long and short dashes in FIG. 4, the potential level of the second transfer channel is set to be equal to that of the first transfer channel. Therefore, a sufficient self inducted drift electric field cannot be obtained. Furthermore, in the conventional device, part of the charge is transferred for a long distance via the first transfer channel, as indicated by line C of FIG. 5, thus decreasing the transfer speed.

Figure 6:
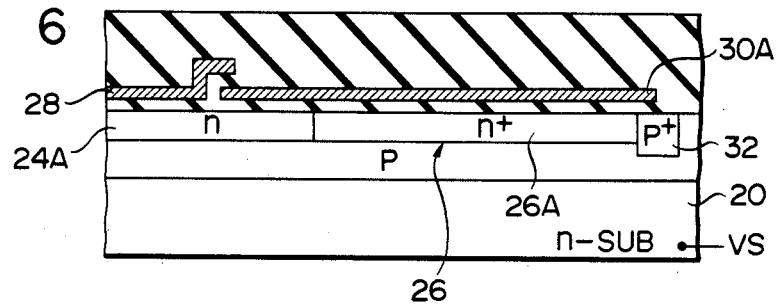
FIGS. 6 and 7 show a structure of said-state image sensing device according to the second embodiment of the present invention.
Figure 7:
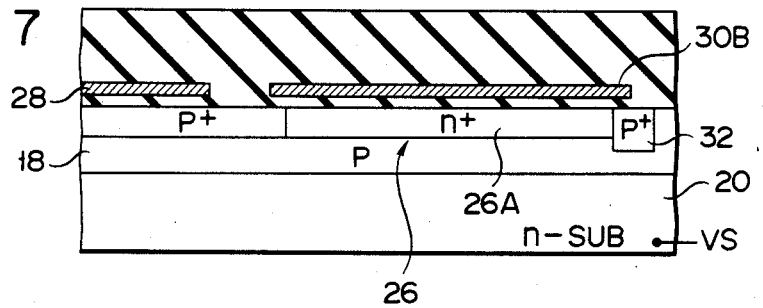

The second embodiment of the present invention will now be described with reference to FIGS. 6 and 7. The charge transfer device according to the embodiment has the same structure as the device of the first embodiment except the portions described in the following. FIG. 6 is a cross-sectional view of the device corresponding to that taken along the line I—I in FIG. 1. FIG. 7 is a cross-sectional view of the device corresponding to that taken along the line II—II in FIG. 1. P$^-$-type region 22 as shown in FIGS. 2 and 3 is not formed in the second embodiment. Instead of region 22, this device includes first and second transfer channels 24A-24D and 26 formed in the surface area of p-type region 18. N$^+$-type region 26A as shown in FIGS. 6 and 7 is formed in transfer channel 26 with an impurity concentration level higher than that of transfer channels 24A to 24D. In FIGS. 6 and 7, n$^+$-type region 26A occupies all of transfer channel 26.

When a clock pulse is selectively applied to one of the transfer electrodes 30A to 30H, for example, electrode 30A, the potential of transfer channel 26 (or n-type region 26A) is set to a lower level than that of transfer channel 24A in the position under electrode 30A. The potential difference is determined corresponding to the impurity concentration levels of transfer channels 24A and 26. During the transfer, the charge cannot move from transfer channel 26 into transfer channels 24A to 24D due to the electrical barrier.

Figure 8:
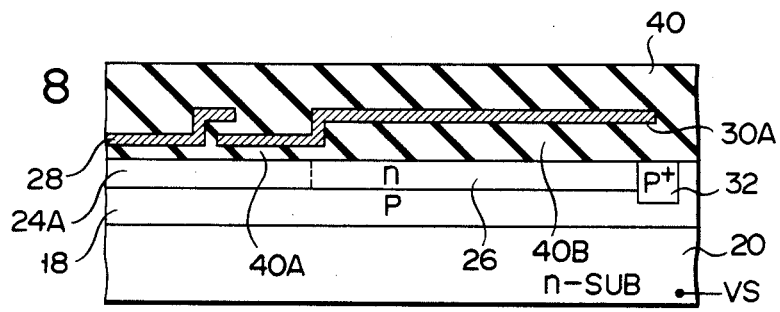
FIGS. 8 and 9 show a structure of a solid-state image sensing device according to the third embodiment of the present invention.
Figure 9:
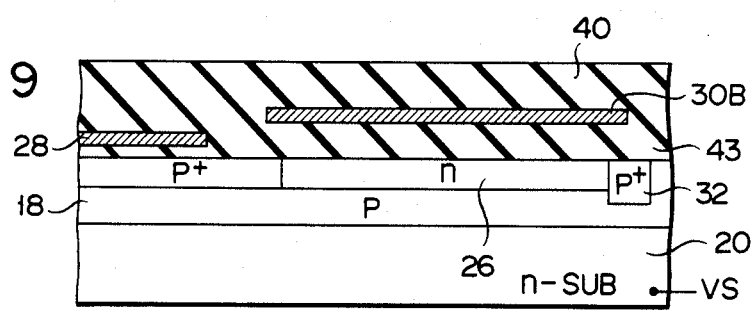

A charge transfer device according to the third embodiment is shown in FIGS. 8 and 9. This device has the same structure as the device of the first embodiment except the portions described in the following. FIG. 8 shows a cross-sectional structure of the device corresponding to that along line I—I in FIG. 1. FIG. 9 shows a cross-sectional structure of the device corresponding to that along line II—II in FIG. 1. In the third embodiment, p$^-$-type region 22 as shown in FIGS. 2 and 3 is not formed. In place of region 22, this device has first and second transfer channels formed in the surface area of p-type region 18 and formed of a single n-type region. Insulating layer 40 shown in FIGS. 8 and 9 is formed for insulating electrodes 30A-30H and 28 from the transfer channels 26 and 24A-24D and for protecting the semiconductor structure. Insulating layer 40 includes portion 40A formed on transfer channels 24A to 24D with a first thickness and portion 40B formed on transfer channel 26 with a second thickness thicker than the first thickness. Electrodes 30A, 30C, 30E and 30G are formed on portions 40A and 40B as shown in FIG. 8. Electrodes 30B, 30D, 30F and 30H are formed on portion 40B as shown in FIG. 9.

When a clock pulse is selectively applied to one of electrodes 30A-30H, for example, electrode 30A, the potential of transfer channel 26 is set to a lower level than that of transfer channel 24A in the position under the electrode 30A. The potential difference is determined corresponding to the distance from transfer channels 24A and 26 to electrode 30A. During the transfer, the charge cannot move from transfer channel 26 into transfer channels 24A to 24D due to the electrical barrier. In the second and third embodiments, the same effects can be obtained as in the first embodiment.

In the embodiments described above, electrons are used as charge carriers. However, holes may be used instead of the electrons. In this case, the semiconductor regions of a charge transfer device have respectively opposite conductivity types.

What is claimed is:

1. A charge transfer device comprising:
   a semiconductor substrate;
   charge supplying means including a plurality of supply channels of a second conductivity type of uniform impurity concentration formed in the surface area of the substrate and extending in a first direction for supplying charge through said supply channels;
   a charge coupled device, including a transfer channel having a control region of the second conductivity type of uniform impurity concentration having the same impurity concentration as each of the supply channels and formed in the surface area of the substrate in direct contact with a contiguous portion of each of the supply channels and extending in a second direction different from the first direction, a plurality of first and second electrodes arranged in the second direction, and voltage applying means for selectively applying a control voltage to the first and second electrodes to transfer charge in the second direction, each of said first electrodes being insulatively formed to extend over a portion of said control region and over said contiguous portion of a corresponding one of the supply channels, each of said second electrodes being insulatively formed to extend over a portion of said transfer channel; and
   potential control means including a first embedded layer of a first conductivity type and uniform impurity concentration underlying the control region of the transfer channel and a second embedded layer of the first conductivity type and uniform impurity concentration underlying the contiguous portion of the corresponding supply channel, the impurity concentration of said first embedded layer underlying the control region being different than that of said second embedded layer underlying the contiguous portion of the corresponding supply channel, for keeping the electrostatic potential energy of the control region and the contiguous portion of the corresponding supply channel at respective first and second levels, with the first level lower than the second level, wherein charge is transferred from the supply channels to the transfer channel when the control voltage is applied to each of the first electrodes.

2. A charge transfer device according to claim 1, wherein said charge supplying means includes a plurality of photoelectric transducers for generating charges and supplying the charges to said supply channels, and transfer means for transferring the charges in said supply channels.

3. A charge transfer device comprising:
   a semiconductor substrate;
   charge supplying means including a plurality of supply channels of a first conductivity type of uniform impurity concentration formed in the surface area of the substrate and extending in a first direction for supplying charge through said supply channels;

a charge coupled device, including a transfer channel having a control region of the first conductivity type of uniform impurity concentration formed in the surface area of the substrate in direct contact with a contiguous portion of each of the supply channels and extending in a second direction different from the first direction, a plurality of first and second electrodes arranged in the second direction, and voltage applying means for selectively applying a control voltage to the first and second electrodes to transfer charge in the second direction, each of said first electrodes being insulatively formed to extend over a portion of said control region and over said contiguous portion of a corresponding one of the supply channels, each of said second electrodes being insulatively formed to extend over a portion of said transfer channel; and potential control means including the control region of the transfer channel and the contiguous portion of the corresponding supply channel, the impurity concentration of the control region being different than that of the contiguous portion of the corresponding supply channel, for keeping the electrostatic potential energy of the control region and the contiguous portion of the corresponding supply channel at respective first and second levels, with the first level lower than the second level, wherein charge is transferred from the supply channels to the transfer channel when the control voltage is applied to each of the first electrodes.

4. A charge transfer device according to claim 3, wherein said potential control means further has an embedded layer of a second conductivity type formed in said substrate, the bottom surfaces of said supply and transfer channels being in contact with said embedded layer.

5. A charge transfer device according to claim 4, wherein said charge supplying means includes a plurality of photoelectric transducers for generating charges and supplying the charges to said supply channels, and transfer means for transferring the charges in said supply channels.

6. A charge transfer device comprising:
a substrate;
charge supplying means including a plurality of supply channels formed in the surface area of said substrate and extending in a first direction for supplying charges through said supply channels;

a charge coupled device including a transfer channel formed in the surface area of said substrate in contact with said supply channels and extending in a second direction different from said first direction, a plurality of first and second electrodes arranged in the second direction, and voltage applying means for selectively applying a control voltage to the first and second electrodes to transfer charge in the second direction, each of said first electrodes being insulatively formed to extend over a portion of said transfer channel and over a portion of a different one of said supply channels, each of said second electrodes being insulatively formed to extend over a portion of said transfer channel; and potential control means for keeping the electrostatic potential energy under each first electrode in a portion of said transfer channel and a portion of a corresponding supply channel at respective first and second levels when the control voltage is applied to each of said first electrodes, with the first level lower than the second level, wherein said potential control means includes an insulating layer formed on said supply channels with a first thickness and on said transfer channel with a second thickness larger than said first thickness, said first and second electrodes being formed on said insulating layer.

7. A charge transfer device according to claim 6, wherein said substrate is a semiconductor substrate, and said supply channels and tranasfer channel are formed of a first conductivity type.

8. A charge transfer device according to claim 7, wherein said potential control means further has an embedded layer of a second conductivity type formed in said substrate, the bottom surface of said supply and transfer channels being in contact with said embedded layer.

9. A charge transfer device according to claim 8, wherein said charge supplying means includes a plurality of photoelectric transducers for generating and supplying the charges to said supply channels, and transfer means for transferring the charges in said supply channels.

* * * * *